United States Patent
Park et al.

(10) Patent No.: US 7,548,466 B2
(45) Date of Patent: *Jun. 16, 2009

(54) FLASH MEMORY DEVICE AND VOLTAGE GENERATING CIRCUIT FOR THE SAME

(75) Inventors: Sang-Kug Park, Bucheon-si (KR); Dae-Han Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 187 days.

This patent is subject to a terminal disclaimer.

(21) Appl. No.: 11/521,479

(22) Filed: Sep. 15, 2006

(65) Prior Publication Data

US 2007/0081392 A1 Apr. 12, 2007

(30) Foreign Application Priority Data

Oct. 10, 2005 (KR) .................... 10-2005-0095028

(51) Int. Cl.
*G11C 5/14* (2006.01)
(52) U.S. Cl. .................... 365/189.09; 365/226; 365/229
(58) Field of Classification Search ............ 365/189.01, 365/189.09, 226, 229
See application file for complete search history.

(56) References Cited

U.S. PATENT DOCUMENTS

| | | | | |
|---|---|---|---|---|
| 5,864,504 A | * | 1/1999 | Tanzawa et al. | 365/185.24 |
| 6,704,224 B2 | * | 3/2004 | Natori | 365/185.18 |
| 6,747,894 B2 | * | 6/2004 | Kawamura | 365/185.03 |
| 6,768,676 B2 | | 7/2004 | Hirano | |
| 7,019,730 B2 | * | 3/2006 | Tsuchiya | 345/98 |

FOREIGN PATENT DOCUMENTS

| | | |
|---|---|---|
| JP | 2001-028194 | 1/2001 |
| JP | 2002-373942 | 12/2002 |
| JP | 2003-217287 | 7/2003 |
| JP | 2003-223791 | 8/2003 |
| KR | 10-1996-041393 | 9/1996 |
| KR | 10-2000-0005360 | 2/2000 |
| KR | 1020000007228 A | 2/2000 |
| KR | 1020000077315 A1 | 12/2000 |
| KR | 1020010039359 A | 5/2001 |
| KR | 1020010057487 A | 7/2001 |
| KR | 1020010077519 A | 8/2001 |
| KR | 1020030094819 A | 12/2003 |

* cited by examiner

*Primary Examiner*—VanThu Nguyen
(74) *Attorney, Agent, or Firm*—Volentine & Whitt, PLLC

(57) ABSTRACT

A flash memory device includes a memory cell array including a plurality of memory cells. The flash memory device also includes a voltage generating circuit which generates a plurality of constant voltages to be applied to the memory cell array, the voltage generating circuit including a plurality of voltage regulators which generate at least two constant voltages, each having a constant voltage difference.

17 Claims, 6 Drawing Sheets

FLASH MEMORY DEVICE AND VOLTAGE GENERATING CIRCUIT FOR THE SAME

BACKGROUND OF THE INVENTION

The present invention relates to a semiconductor memory device and, more particularly, to a flash memory device and a voltage generating circuit for the same.

A claim of priority is made to Korean Patent Application No. 2005-95028, filed on Oct. 10, 2005, in the Korean Intellectual Property Office, the disclosure of which is incorporated herein in its entirety by reference.

DISCUSSION OF RELATED ART

Semiconductor memories are usually considered to be a vital microelectronic component of digital logic system design. For example, semiconductor memories are extensively used in devices such as computers and in microprocessor-based applications ranging from satellites to consumer electronics.

In order to keep up with the increasing demand for semiconductor memories, various advances have been, and are being made in the field of semiconductor memory fabrication. These advances include, for example, enhancements in the semiconductor fabrication process, increasing the scalability of semiconductor memories by increasing the integration density of semiconductor memories, and increasing the operating speeds of semiconductor memories.

Generally, semiconductor memory devices are categorized as volatile memory devices or non-volatile memory devices. There are some distinct differences between volatile and non-volatile memory devices. For example, volatile semiconductor devices lose their data when their power supplies are interrupted, while the non-volatile memory devices retain their stored data even when their power supplies are interrupted. The non-volatile memories include, for example, mask read-only memories (MROMs), programmable read-only memories (PROMs), erasable programmable read-only memories (EPROMs), and electrically erasable programmable read-only memories (EEPROMs).

However, MROMs, PROMs, and EPROMs have a difficulty in rewriting stored data because read and write operations cannot be freely conducted by normal users. On the other hand, EEPROMs are increasingly used in system programming that requires the continuous update or auxiliary memory devices. Particularly, flash EEPROMs can be advantageously used as mass storage devices because their integration density is higher than conventional EEPROMs.

Flash memory devices are classified into NOR-type flash memories (hereinafter referred to as "NOR flash memories") and NAND-type flash memories (hereinafter referred to as "NAND flash memories"). This classification is based on cell-bitline connection states. For example, in a NOR flash memory, at least two cell transistors are connected to a bitline in parallel. Furthermore, NOR flash memories store data by means of channel hot electron and erase data by means of F-N tunneling. In contrast, in a NAND flash memory, at least two cell transistors are connected to a bitline in series. Furthermore, NAND flash memories store and erase data by means of F-N tunneling. Generally, NOR flash memories are disadvantageous in increasing integration density due to their high power consumption. However, NOR flash memories have the advantage of having a high operating speed. In recent years, many efforts have been made towards increasing the integration density of NOR flash memories. One of these efforts is based on the concept of a multi-level cell (hereinafter referred to as "MLC").

FIG. 1 illustrates threshold voltages of a MLC and the data distribution of the threshold voltages in a MLC. Specifically, FIG. 1 illustrates threshold voltage distributions of a MLC in which 2-bits of data are stored per cell and also illustrates the data values corresponding to the threshold voltages.

In a case where, for example, single-bit data is stored in a flash memory, data stored in a unit cell may be expressed by two threshold voltage distributions, each corresponding to data "1" and data "0". On the other hand, in a case where multi-bit data is stored in a flash memory, data stored in a unit cell may be expressed by four threshold voltage distributions, each corresponding to data "11", data "10", data "00", and data "01", as illustrated in FIG. 1. Values of data stored in a cell are arranged as "11", "10", "00", and "01", according to the ascending order of threshold voltage states. Generally, the "11" state is an erased state and programming begins from the erased state "11".

A plurality of constant voltages are required for programming, erasing, and reading single-bit data or multi-bit data into/from a flash memory cell. These constant voltages are generated from a voltage generating circuit. Among the constant voltages generated from the voltage generating circuit, program verify voltages Vvrf1, Vvrf2, and Vvrf3 and read voltages Vread0, Vread1, and Vread2 are illustrated in FIG. 1. Namely, these illustrated voltages are a part of the constant voltages generated from the voltage generating circuit. As the number of bits of data stored in respective cells increases, the number of levels of a wordline voltage also increases for programming, erasing, and reading the respective data.

Because each constant voltage is usually generated from an independent regulating circuit, an additional control signal is required for generating and maintaining each constant voltage. Furthermore, a circuit is also required for controlling the control signal. Accordingly, with an increase in a number of levels of a bitline voltage, the configuration of a circuit for generating each voltage becomes complex and a chip size increases. Moreover, if characteristics of each regulating circuit are altered due to, for example, changes in the fabrication process of the semiconductor memory, a deviation between the generated voltages may increase due to a reduction in a sensing margin.

The present disclosure is directed towards overcoming one or more problems associated with generating constant voltages for programming, reading, and erasing non-volatile memories.

SUMMARY OF THE INVENTION

An aspect of the present disclosure includes a flash memory device. The flash memory device includes a memory cell array including a plurality of memory cells. The flash memory device also includes a voltage generating circuit which generates a plurality of constant voltages to be applied to the memory cell array, the voltage generating circuit including a plurality of voltage regulators which generate at least two constant voltages, each having a constant voltage difference.

Yet another aspect of the present disclosure includes a voltage generating circuit. The voltage generating circuit includes a charge pump which generates a high voltage higher than a power supply voltage through a charge pumping operation. The voltage generating circuit also includes a first-type voltage regulator which divides a voltage generated from the charge pump to generate a plurality of control signals. The voltage generating circuit also includes a plurality of second-type voltage regulators each dividing a voltage generated from the charge pump to generate at least two constant voltages. The voltage generating circuit also includes a controller which controls the charge pumping operation in response to the control signals, wherein the second-type regulators share a voltage-dividing path used to generate the at least two constant voltages.

DETAILED DESCRIPTION OF PREFERRED EMBODIMENTS

In an exemplary embodiment, a flash memory device shares a circuit configuration for generating at least two constant voltages such as, for example, a read voltage and a program verify voltage, while they have a constant voltage difference. At this point, a read voltage generated has a standby-state voltage level or an active-state voltage level. Furthermore, an output port of a standby-state read voltage and an output port of an active-state read voltage are commonly coupled with each other. In addition, each of the read voltages is regulated to a constant level by means of feedback loop. Furthermore, outputs of read voltages having different states are co-regulated through the output ports commonly coupled with each other. The configuration of the flash memory device will now be described below in detail.

Figure 2:
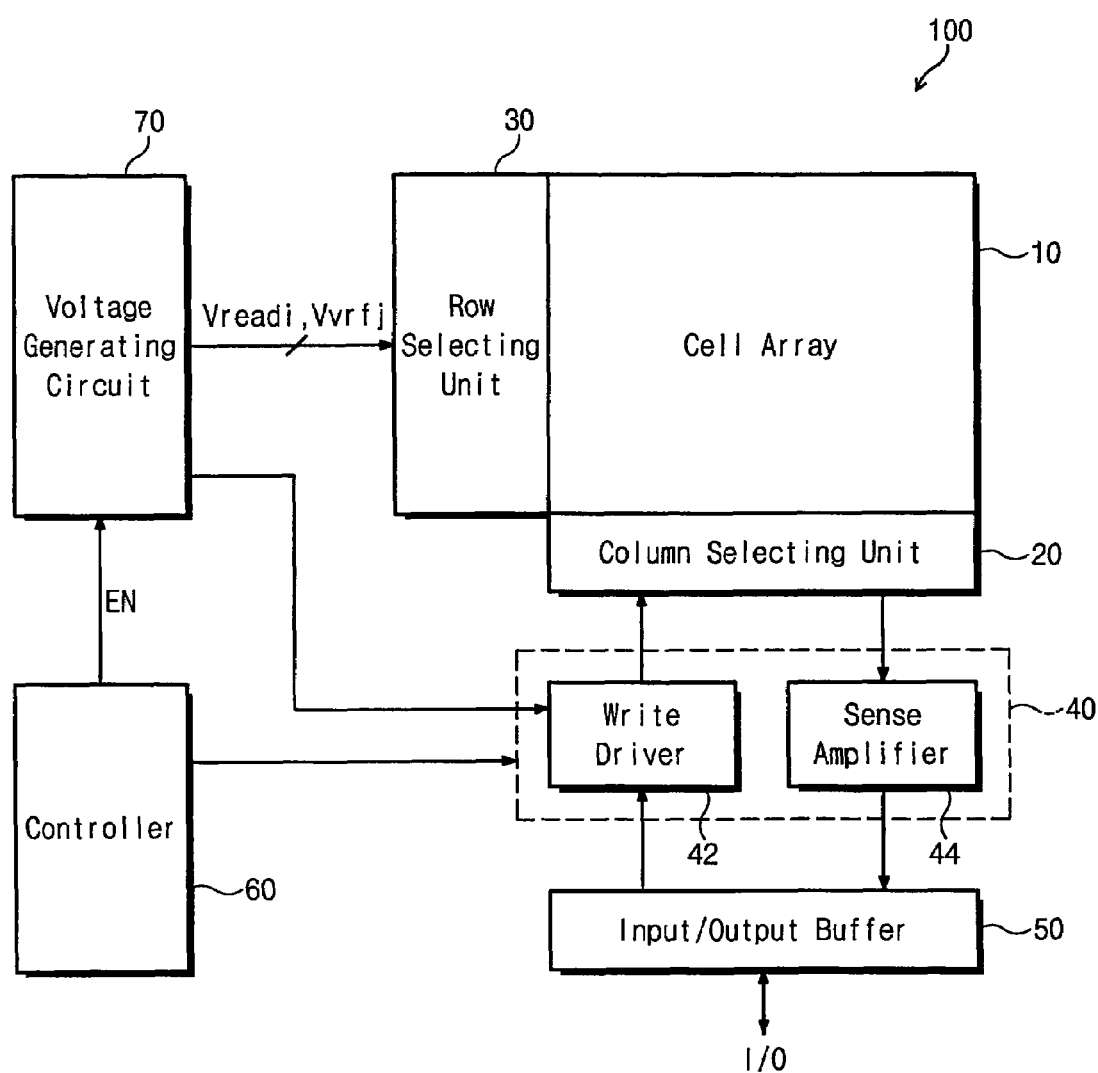
FIG. 2 is a block diagram of a flash memory device according to an exemplary disclosed embodiment of the present invention.

FIG. 2 illustrates the configuration of a flash memory device 100. In an exemplary embodiment, the flash memory device 100 is a NOR flash memory device adopting MLC data storage.

As illustrated in FIG. 2, the flash memory device 100 includes a memory cell array 10, a column selecting unit 20, a row selecting unit 30, a data input/output circuit 40, an input/output buffer 50, a controller 60, and a voltage generating circuit 70.

The memory cell array 10 includes a plurality of memory cells arranged at intersections of rows (i.e., wordlines) and columns (i.e., bitlines). The voltage generating circuit 70 generates a plurality of constant voltages required for programming, erase, and reading a memory cell. As described below in detail, the voltage generating circuit 70 includes a circuit configuration to generate a constant read voltage $Vread_i$ and a constant program verify voltage $Vvrf_j$ instead of having an independent circuit configuration to generate each constant voltage. In addition, there is a constant voltage difference between the read voltage $Vread_i$ and the corresponding program verify voltage $Vvrf_j$ generated by the voltage generating circuit 70.

Each of the voltages $Vread_i$ and $Vvrf_j$ generated from the voltage generating circuit 70 is laid in a standby state or an active state. Whether the generated voltage is in a standby state or an active state depends on whether an enable signal EN generated from the controller 60 is activated.

Each of the voltages $Vread_i$ and $Vvrf_j$ is regulated to a constant level through feedback loop. In an exemplary embodiment, an output node for outputting a standby-state voltage and an output node for outputting an active-state voltage are commonly connected to co-regulate voltage levels of the two different states.

The row selecting unit 30 selects one of the constant voltages generated from the voltage generating circuit 70 and applies the selected voltage to a corresponding wordline. In addition, the column selecting unit 20 selects a bitline to which a cell to be programmed (or read) is connected, from amongst a plurality of memory cells included in a selected wordline.

The input/output buffer 50 stores data to be programmed into the memory cell array 10 and data sensed from the memory cell array 10. The data input/output circuit 40 includes a write driver 42 and a sense amplifier 44. The write driver 42 receives data to be programmed from the input/output buffer 50 for programming a selected memory cell. The sense amplifier 44 senses data programmed into a selected memory cell. The data sensed by the sense amplifier 44 is stored in the input/output buffer 50. The controller 60 controls general operations associated with program, erase, and read operations of a flash memory.

For the convenience of description, only the configuration of the voltage generating circuit 70 for generating a read voltage and a program verify voltage will be described below. To prevent repetition, generation of other constant voltages (e.g., a program voltage, an erase voltage, an erase verify voltage, etc.) will not be described below. One skilled in the art will appreciate that the configuration of the voltage generating circuit 70 for generating other constant voltages is similar to that which will be described below.

Figure 3:
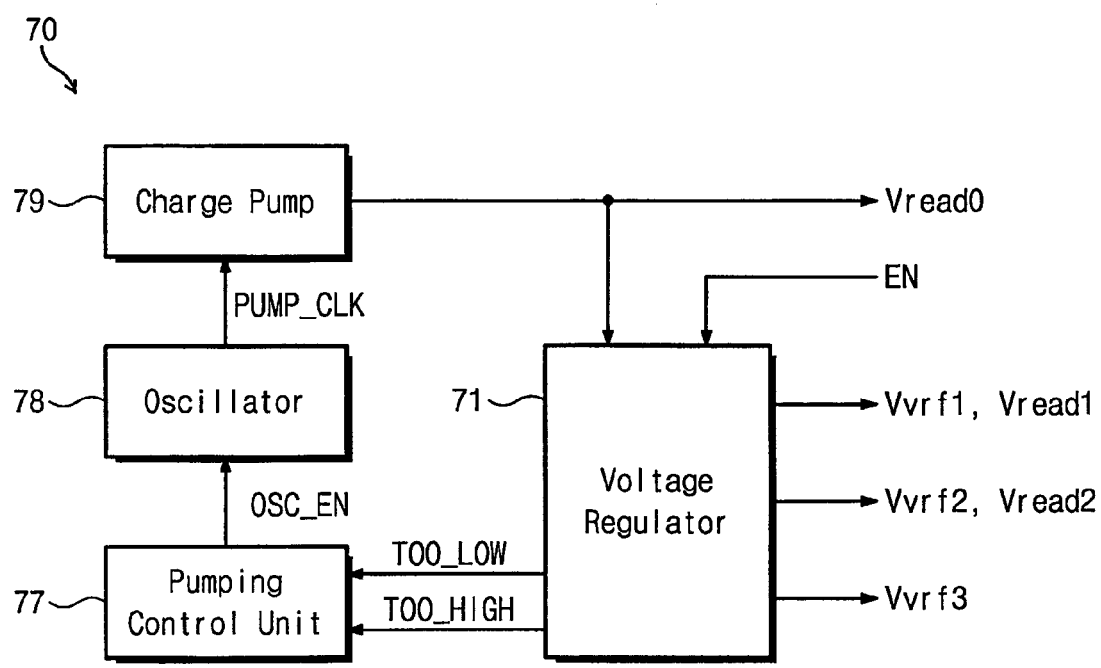
FIG. 3 is a block diagram of a voltage generating circuit shown in FIG. 2.

FIG. 3 is a block diagram of the voltage generating circuit 70 shown in FIG. 2. In FIG. 3, the voltage generating circuit 70 is a voltage generating circuit for an MLC in which 2-bit data per cell is stored. Referring to FIG. 3, the voltage generating circuit 70 includes a voltage regulator 71, a pumping control unit 77, an oscillator 78, and a charge pump 79.

The charge pump 79 generates a high voltage Vread0 that is higher than a power supply voltage. The voltage regulator 71 divides the high voltage Vread0 in response to an enable signal EN generated from the controller 60 (refer to FIG. 2). The voltage-dividing result is used to generate a plurality of read voltages Vread1 and Vread2 and a plurality of program verify voltages Vvrf1, Vvrf2, and Vvrf3, and to control a pumping operation of the charge pump 79.

Figure 1:
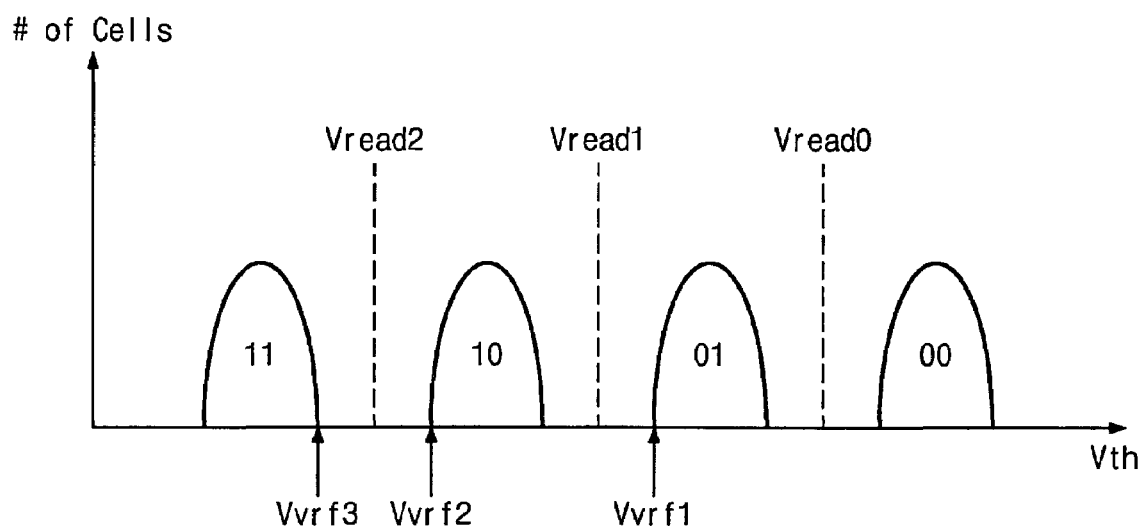
FIG. 1 illustrates threshold voltages of a multi-level cell (MLC) and distributions of data corresponding to the threshold voltages.

The voltage Vread0 generated by the charge pump 79 may be used to read the different data stored in the MLC. For example, the high voltage Vread0 generated from the charge pump 79 is used as a read voltage to read data "01" and data "00" shown in FIG. 1. The first read voltage Vread1 generated by dividing the high voltage Vread0 is used to read the data "10" and data "01" shown in FIG. 1. The second read voltage Vread2 generated by dividing the high voltage Vread0 is used to read data "11" and data "10" shown in FIG. 1. On the other hand, first to third program verify voltages Vvrf1, Vvrf2, and Vvrf3 are used to verify whether a memory cell is programmed to states "01", "10", and "11", respectively.

The voltage regulator 71 is kept in a standby state or an active state depending on whether the enable signal EN generated from the controller 60 is activated. In an exemplary embodiment, a period where a standby-state voltage is generated (i.e., the enable signal EN is deactivated) is referred to as a standby period, and a period where an active-state voltage is generated (i.e., the enable signal EN is activated) is referred to an active period. During the standby period, the flash memory device 100 does not conduct a program operation or a read operation, and the voltage regulator 71 generates standby-state read voltages Vread1 and Vread2. At this point, the read voltages Vread1 and Vread2 generated from the voltage regulator 71 are not applied to a wordline and are maintained at a standby state. On the other hand, during the active period, the flash memory device 100 conducts a program operation or a read operation, and the voltage regulator 71 generates active-state read voltages Vread1 and Vread2 and active-state program verify voltages Vvrf1, Vvrf2, and Vvrf3. Specifically, the read voltages Vread1 and Vread2 and the program verify voltages Vvrf1, Vvrf2, and Vvrf3 are generated by sharing a voltage-dividing path. Furthermore, these generated voltages are applied to a wordline through the row selecting unit 30 of FIG. 2.

Figure 4:
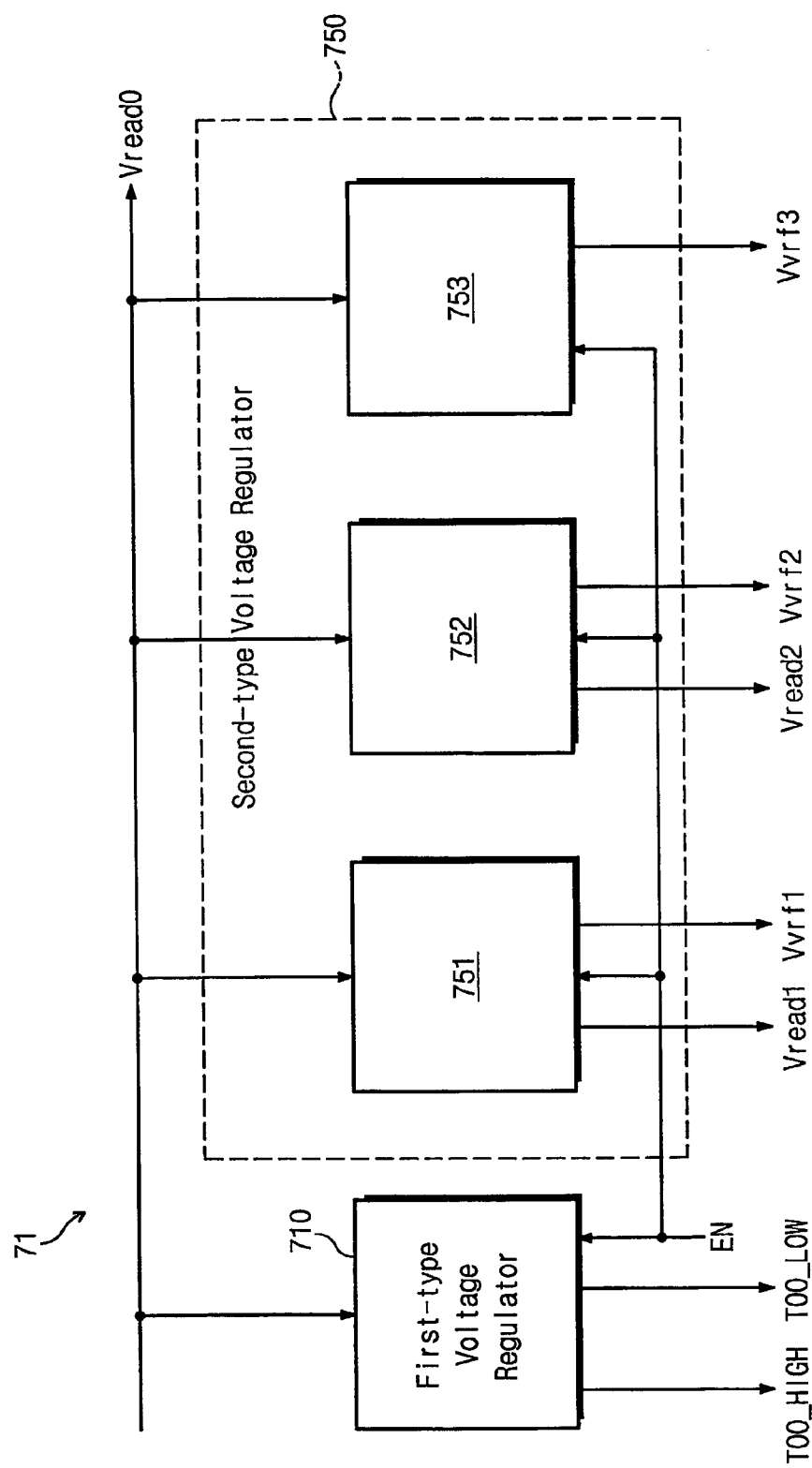
FIG. 4 is a block diagram of a voltage regulator shown in FIG. 3.
Figure 5:
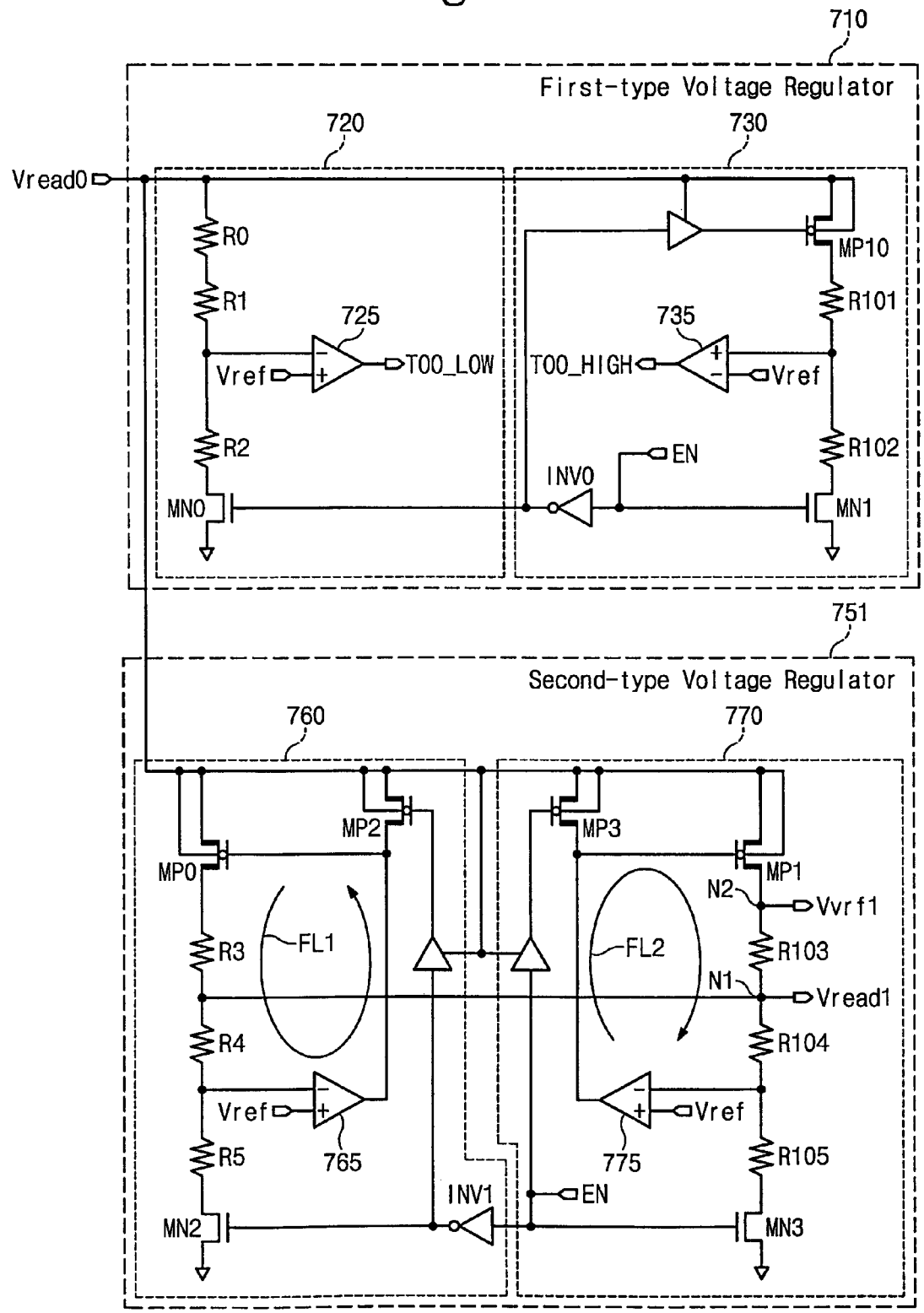
FIG. 5 is a circuit diagram of first and second-type voltage regulators shown in FIG. 4.

A standby-state voltage and an active-state voltage corresponding to each voltage (i.e., read voltage, verify voltage, etc.) are regulated at a constant level through feedback loops FL1 and FL2 of FIG. 5, respectively. In addition, the regulated standby-state voltage and the active-state voltage share an output node. Therefore, each of the regulated voltages may co-regulate an additional voltage laid in another state (e.g., standby state or active state). A configuration where the voltage regulator 71 generates the read voltages Vread1 and Vread2 and the program verify voltages Vvrf1, Vvrf2, and Vvrf3 will be described in detail later with reference to FIG. 4 and FIG. 5.

The voltage regulator 71 may be configured to control a pumping operation of the charge pump 79. Specifically, in an exemplary embodiment, the voltage regulator 71 compares the voltage-dividing result with a predetermined reference voltage Vref to control a pumping operation of the charge pump 79. Furthermore, in response to the comparing result, the voltage regulator 71 generates a first control signal TOO_LOW and a second control signal TOO_HIGH. A configuration where the first and second control signal TOO_LOW and TOO_HIGH are generated will also be described in detail later with reference to FIG. 4 and FIG. 5.

The pumping control unit 77 generates an oscillation enable signal OSC_EN in response to the first and second control signals TOO_LOW and TOO_HIGH generated from the voltage regulator 71. In a case where, for example, the first control signal TOO_LOW is generated from the voltage regulator 71, the pumping control unit 77 generates an activated enable signal OSC_EN. On the other hand, in a case where the second control signal TOO_HIGH is generated from the voltage regulator 71, the pumping control unit 77 generates a deactivated enable signal OSC_EN.

As mentioned above, the voltage generating circuit 70 also includes the oscillator 78. The oscillator 78 generates a pumping clock signal PUMP_CLK in response to the activated oscillation enable signal OSC_EN.

The charge pump 79 performs a charge pumping action in response to the pumping clock signal PUMP_CLK. As a result of the charge pumping, the high voltage Vread0 is generated. The high voltage Vread0 generated from the charge pump 79 is applied to the voltage regulator 71 where the high voltage Vread0 is divided in a predetermined ratio. The voltage-dividing result is in turn used to control the pumping operation of the charge pump 79 and to generate a plurality of read voltages Vread1 and Vread2 and a plurality of program verify voltages Vvrf1, Vvrf2, and Vvrf3. The configuration of the voltage regulator 71 will now be described below in detail.

Figure 6:
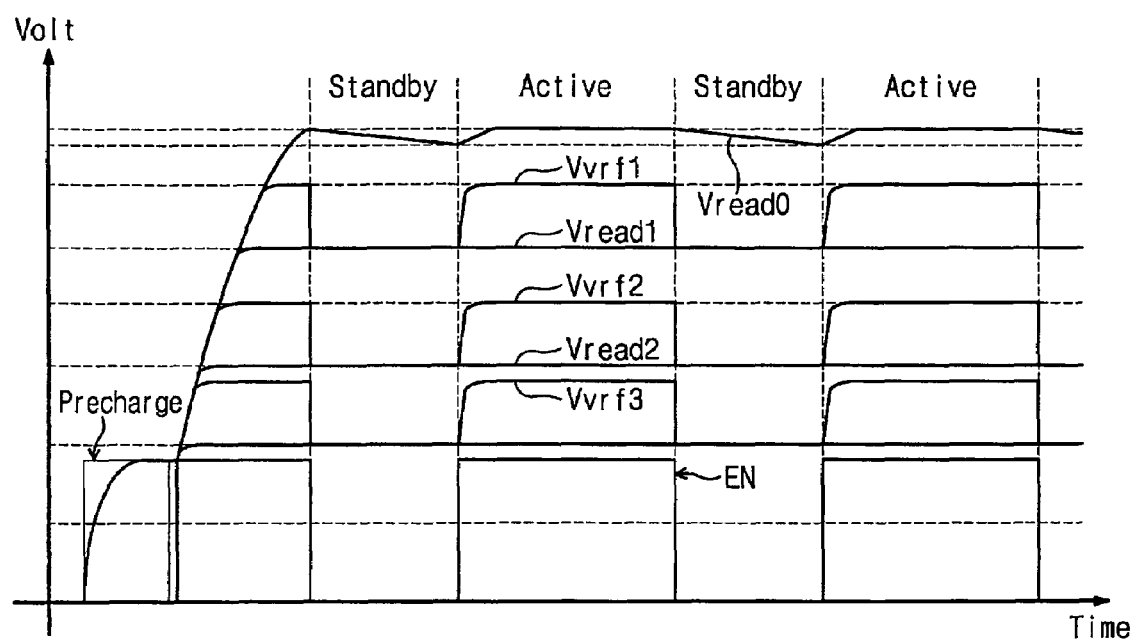
FIG. 6 illustrates an example of voltages generated from the voltage generating circuit shown in FIG. 2.

FIG. 4 is a block diagram of the voltage regulator 71 shown in FIG. 3, and FIG. 5 is a circuit diagram of a first-type voltage regulator 710 and a second-type voltage regulator 750 shown in FIG. 4. Furthermore, FIG. 6 illustrates exemplary voltages generated from the voltage generating circuit 70.

Referring to FIG. 4, the voltage regulator 71 includes a first-type voltage regulator 710 and a plurality of second-type voltage regulators 750 (including 751, 752, and 753). A high voltage Vread0 generated from a charge pump 79 is commonly applied to the first-type voltage regulator 710 and the second-type voltage regulators 750. The first-type voltage regulator 710 divides the applied high voltage Vread0 and controls a charge pumping operation of the charge pump 79 based on the voltage-dividing result. In addition, the second-type voltage regulators 750 divide the applied high voltage Vread0 and generate a plurality of constant voltages Vread1, Vread2, Vvrf1, Vvrf2, and Vvrf3. Furthermore, the plurality of constant voltages Vread1, Vread2, Vvrf1, Vvrf2, and Vvrf3 are applied to a wordline based on the voltage-dividing result. Beneficially, the second-type voltage regulators 751, 752, and 753 have the same configuration but different resistance values based on the levels of desired constant voltages.

Referring to FIG. 5, the first-type voltage regulator 710 includes a first regulating unit 720 and a second regulating unit 730.

The first regulating unit 720 includes resistors R0, R1, and R2, a comparator 725, and a transistor MN0. In terms of operation, the first regulating unit 720 is activated during a period where an enable signal EN generated from the controller 60 is deactivated (i.e., during standby period), to control a pumping operation of the charge pump 79. To this end, the first regulating unit 720 divides a high voltage Vread0 generated from the charge pump 79 through the plurality of resistors R0, R1, and R2 during the standby period. Furthermore, the comparator 725 compares the voltage-dividing result with a predetermined reference voltage Vref. If the voltage-dividing result is lower than the reference voltage Vref, the comparator 725 generates a first control signal TOO_LOW. During a period where the first control signal TOO_LOW is generated, the charge pump 79 conducts a pumping operation. Thus, the high voltage Vread0 generated from the charge pump 79 may always be maintained over a constant level.

The second regulating unit 730 includes resistors R101 and R102, transistors MP10 and MN1, a comparator 735 and inverter INV0. In terms of operation, the second regulating unit 730 is activated during a period where the enable signal EN generated from the controller 60 is activated (i.e., during an active period) to control a pumping operation of the charge pump 79. To this end, the second regulating unit 730 divides the high voltage Vread0 generated from the charge pump 79 through the plurality of resistors R101 and R102 during the active period. Furthermore, the comparator 735 compares the voltage-dividing result with a predetermined reference voltage Vref. If the voltage-dividing result is higher than the reference voltage Vref, the comparator 735 generates a second control signal TOO_HIGH. During a period where the second control signal TOO_HIGH is generated, the charge pump 79 stops conducting the pumping operation. Thus, the high voltage Vread0 generated from the charge pump 79 may be maintained below a constant level.

The second regulating unit 730 has the same configuration as the first regulating unit 720, except that the resistors R101 and R102 of the second regulating unit 730 have lower values than the resistors R0, R1, and R2 of the first regulating unit 720. Due to this difference in resistance values, an output of the second regulating unit 730 has a higher voltage boosting rate than that of the first regulating unit 720.

The configurations of the second-type voltage regulators 751, 752, and 753 will now be described below in detail.

The second-type voltage regulators 751, 752, and 753 share a circuit configuration to generate read voltages Vread1 and Vread2 and program verify voltages Vvrf1, Vvrf2, and Vvrf3. For example, a primary second-type voltage regulator 751 shown in FIG. 4 shares a circuit configuration to generate a first read voltage Vread1 and a first program verify voltage Vvrf1; a secondary second-type voltage regulator 752 shown in FIG. 4 shares a circuit configuration to generate a second read voltage Vread2 and a second program verify voltage Vvrf2; and a tertiary second-type voltage regulator 753 shown in FIG. 4 shares a circuit configuration to generate a read voltage (not shown) and a third program verify voltage Vvrf3. One should note that as far as an output of the tertiary second-type voltage regulator 753 is concerned, only the third program verify voltage Vvrf3 is shown in FIG. 4. This is because another read voltage is not required except for the three read voltages Vread0, Vread1, and Vread3. This being the case because the memory cell disclosed in an exemplary embodiment is an MLC in which 2-bit data per unit cell is stored.

FIG. 5 illustrates a circuit configuration of the primary second-type voltage regulator 751. While the primary second-type voltage regulator 751 generates a first read voltage Vread1 and a first program verify voltage Vvrf1, one skilled in the art will appreciate that the primary second-type voltage regulator 751 is similar in configuration to the other second-type voltage regulators 752 and 753. For example, although the second-type voltage regulators have different resistance values based on their required voltage levels, their configurations are substantially identical to one another.

Referring to FIG. 5, the second-type voltage regulator 751 includes a third regulating unit 760 and a fourth regulating unit 770. The third regulating unit 760 is activated during a standby period wherein it divides a high voltage Vread0 to generate a first read voltage Vread1. A comparator 765 compares the resulting voltage drop with a predetermined reference voltage Vref. If the voltage-dividing result is lower than the reference voltage Vref, a first feedback path is formed at the first regulating unit 760. Furthermore, the first regulating unit 760 repeatedly conducts a voltage-dividing operation along the first feedback path until the voltage-dividing result reaches a constant level. As a result, the first read voltage Vread1 is regulated to the constant level. In this case, a first transistor MP0 and a second transistor MP1 constructed in the third regulating unit 760 are used to form the first feedback path FL1 in response to the comparing result.

A first program verify voltage Vvrf1 regulated to the constant level along the first feedback path FL1 is output to a row selecting unit 30 through a first node N1. At the same time, the first read voltage Vread1 is provided to the fourth regulating unit 740.

In an exemplary embodiment, the third and fourth regulating units 760 and 770 share the first node N1 that outputs the first read voltage Vread1. Because the fourth regulating unit 770 is deactivated during a standby state, the first read voltage Vread1 charges an output port of the fourth regulating unit 770 to a constant level. Thus, although an operation mode changes from a standby mode to an active mode, an active-state first read voltage Vread1 and an active-state program verify voltage Vvrf1 may be effectively generated without overworking the pumping operation of the charge pump 79.

During an active period, the fourth regulating unit 770 uses a plurality of resistors R103, R104, and R105 to divide a high voltage Vread0 that is generated from the charge pump 79. As a result, a first read voltage Vread1 and a first program verify voltage Vvrf1 are generated. A comparator 107 compares the voltage-dividing result that has a lower level than the first read voltage Vread1 with a predetermined reference voltage Vref. If the voltage-dividing result is lower than the reference voltage, a second feedback path FL2 is formed at the fourth regulating unit 770. Furthermore, the fourth regulating unit 770 repeatedly conducts a voltage-dividing operation along the second feedback path FL2 until the voltage-dividing result reaches a predetermined level. Thus, the first read voltage Vread1 and the first program verify voltage Vvrf1 are regulated to a constant level. In this case, a third transistor MP1 and a fourth transistor MP3 in the fourth regulating unit 770 form the second feedback path FL2 in response to the comparing result.

A first read voltage Vread1 regulated to a constant level along the second feedback path FL2 is output to the row selecting unit 30 and the third regulating unit 760. In addition, a first program verify voltage Vvrf1 regulated to a constant level along the second feedback path FL2 is output to the row selecting unit 30 through a second node N2. Furthermore, during an active period, the first read voltage Vread1 and the first program verify voltage Vvrf1 input to the row selecting unit 30 are applied to a corresponding wordline according to the decoding result. In addition, the first read voltage Vread1 provided to the third regulating unit 760 charges an output port of an inactive-state third regulating unit 760 to a constant level. Thus, although the operation mode changes from an active mode to a standby mode, a standby voltage having a constant level may be effectively generated while reducing the pumping operation of the charge pump 79.

As illustrated in FIG. 6, a first program verify voltage Vvrf1 has a higher level value than a first read voltage Vread1. Generally, a program verify operation and a read operation may be conducted accurately when a constant voltage difference is maintained between a program verify voltage Vvrf1 and a read voltage Vread1. However, if the program verify voltage Vvrf1 and the read voltage Vread1 are generated through independent circuits, a deviation is generated between the voltages Vvrf1 and Vread1. Furthermore, because of the lack of dependence between the voltage generating circuits, it may be difficult to maintain a constant voltage difference between the read and verify voltages Vread1 and Vvrf1, respectively.

However, if the voltages Vread1 and Vvrf1 are all generated through a common voltage-dividing path, it may be possible to maintain a constant voltage difference between the read and verify voltages Vread1 and Vvvrf1, respectively. This being the case even if the-characteristics of the circuit including the voltage-dividing path change because of alterations made to the manufacturing process of the circuit. As mentioned above, this constant voltage difference between the read and verify voltages may lead to accurate executions of read and verify operations in the memory device. This accuracy of operation may make it possible to obtain a sufficient sensing margin and prevent errors arising from a program verify operation and a read operation. Furthermore, because the Vread1 and Vvrf1 voltages are generated through one circuit configuration, the configuration of a memory device may be simplified and the chip size may also be reduced.

In addition, the voltage generating circuit 70 does not always generate a first read voltage Vread1 and a first program verify voltage Vvrf1, but generates the same only during a period where an enable signal EN is activated (i.e., during an active period). Therefore, an unnecessary pumping operation of the charge pump 79 is reduced thus reducing the power consumption of the memory device 100.

The foregoing exemplary embodiments are teaching examples. Those of ordinary skill in the art will understand that various changes in form and details may be made to the exemplary embodiments without departing from the scope of the present invention which is defined by the following claims and their equivalents.

What is claimed is:

1. A flash memory device comprising:
a memory cell array including a plurality of memory cells; and
a voltage generating circuit which generates a plurality of constant voltages to be applied to the memory cell array, the voltage generating circuit including a plurality of voltage regulators which generate at least two constant voltages, each having a constant voltage difference,
wherein each of the voltage regulators generates a first constant voltage during a standby period and generates a first voltage and a second voltage having a constant voltage difference relative to the first voltage during an active period.

2. The flash memory device of claim 1, wherein the voltage regulators share an output port outputting the first constant voltage during the standby state and share an output terminal outputting the first voltage during the active period.

3. The flash memory device of claim 2, wherein each of the voltage regulators forms a first feedback loop which constantly regulates a level of the first constant voltage during the standby period.

4. The flash memory device of claim 3, wherein the first constant voltage regulated during the standby period constantly regulates a level of the first voltage to be output during the active period, through the shared output port.

5. The flash memory device of claim 3, wherein the first constant voltage regulated during the standby period constantly regulates levels of the first and second voltages to be output during the active period, through the shared output port.

6. The flash memory device of claim 2, wherein each of the voltage regulators forms a second feedback loop which constantly regulates a level of the first voltage during the active period.

7. The flash memory device of claim 6, wherein the second feedback loop is used to constantly regulate levels of the first and second voltages.

8. The flash memory device of claim 6, wherein the first voltage regulated during the active period constantly regulates a level of the first constant voltage to be output during the standby period, through the shared output port.

9. A voltage generating circuit comprising:
a charge pump which generates a high voltage higher than a power supply voltage through a charge pumping operation;
a first-type voltage regulator which divides a voltage generated from the charge pump to generate a plurality of control signals;
a plurality of second-type voltage regulators, wherein each of the plurality of second-type voltage regulators divides a voltage generated from the charge pump to simultaneously generate at least two constant voltages; and
a controller which controls the charge pumping operation in response to the control signals,
wherein the second-type regulators share a voltage-dividing path used to generate the at least two constant voltages.

10. A voltage generating circuit comprising:
a charge pump which generates a high voltage higher than a power supply voltage through a charge pumping operation;
a first-type voltage regulator which divides a voltage generated from the charge pump to generate a plurality of control signals;
a plurality of second-type voltage regulators each dividing a voltage generated from the charge pump to generate at least two constant voltages; and
a controller which controls the charge pumping operation in response to the control signals, wherein the second-type regulators share a voltage-dividing path used to generate the at least two constant voltages, and
wherein each of the second-type voltage regulators generates a first constant voltage during a standby period and generates a first voltage and a second voltage having a constant voltage difference relative to the first voltage during an active period.

11. The voltage generating circuit of claim 10, wherein the second-type voltage regulators share an output port outputting the first constant voltage during the standby period and an output port outputting the first voltage during the active period.

12. The voltage generating circuit of claim 11, wherein each of the second-type voltage regulators forms a first feedback loop which constantly regulates a level of the first constant voltage during the standby period.

13. The voltage generating circuit of claim 12, wherein the first constant voltage regulated during the standby period constantly regulates a level of the first voltage to be output during the active period, through the shared output port.

14. The voltage generating circuit of claim 12, wherein the first constant voltage regulated during the standby period constantly regulates levels of the first and second constant voltages to be output during the active period, through the shared output port.

15. The voltage generating circuit of claim 11, wherein each of the second-type voltage regulators forms a second feedback loop which constantly regulates a level of the first voltage during the active period.

16. The voltage regulating circuit of claim 15, wherein the second feedback loop is used to constantly regulate levels of the first and second voltages.

17. The voltage regulating circuit of claim 15, wherein the first voltage regulated during the active period constantly regulates a level of the first constant voltage to be output during the standby period, through the shared output port.

* * * * *